(12) United States Patent
Lim et al.

(10) Patent No.: US 11,650,232 B2
(45) Date of Patent: *May 16, 2023

(54) SUPPLY VOLTAGE DETECTING CIRCUIT, METHOD OF OPERATING THE SAME, ELECTRONIC DEVICE COMPRISING THE SAME AND ELECTRONIC SYSTEM COMPRISING THE SAME

(71) Applicant: Samsung Electronics Co., Ltd., Suwon-si (KR)

(72) Inventors: Cheolhwan Lim, Suwon-si (KR); Junhee Shin, Yongin-si (KR); Haejung Choi, Daegu (KR); Kwangho Kim, Yongin-si (KR); Hyunmyoung Kim, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/872,363

(22) Filed: Jul. 25, 2022

(65) Prior Publication Data

US 2022/0357372 A1 Nov. 10, 2022

Related U.S. Application Data

(63) Continuation of application No. 17/036,394, filed on Sep. 29, 2020, now Pat. No. 11,397,199.

(30) Foreign Application Priority Data

Jan. 30, 2020 (KR) .................. 10-2020-0011346

(51) Int. Cl.
*G01R 19/165* (2006.01)
*H03K 17/687* (2006.01)
(Continued)

(52) U.S. Cl.
CPC .............. *G01R 19/165* (2013.01); *G06F 1/24* (2013.01); *G06F 1/28* (2013.01); *H03K 3/037* (2013.01); *H03K 17/6872* (2013.01)

(58) Field of Classification Search
CPC ............ H03K 3/037; H03K 5/08; H03K 5/22; H03K 5/24; H03K 5/2472; H03K 5/249;
(Continued)

(56) References Cited

U.S. PATENT DOCUMENTS 5,136,181 A 8/1992 Yukawa
5,847,586 A 12/1998 Burstein et al.
(Continued)

FOREIGN PATENT DOCUMENTS

KR 10-0891389 B1 4/2009
KR 10-1226030 B1 1/2013

*Primary Examiner* — Long Nguyen
(74) *Attorney, Agent, or Firm* — Harness, Dickey & Pierce, P.L.C.

(57) ABSTRACT

An electronic device includes circuitry configured to output a first output signal shifting to a logic high level at a first time in response to a supply voltage reaching a first voltage level, output a second output signal shifting to a logic high level at a second time occurring after the first time in response to the supply voltage reaches a second level higher than the first level; and the circuitry includes an AND gate circuit configured to output a reset signal based on the first output signal and the second output signal.

20 Claims, 8 Drawing Sheets

(51) Int. Cl.
*H03K 3/037* (2006.01)
*G06F 1/24* (2006.01)
*G06F 1/28* (2006.01)

(58) Field of Classification Search
CPC .............. H03K 17/6872; G01R 19/165; G01R 19/16504; G01R 19/16519; G01R 19/16566; G01R 19/16571; G01R 19/16576; G06F 1/24; G06F 1/28
See application file for complete search history.

(56) References Cited

U.S. PATENT DOCUMENTS

| | | | |
|---|---|---|---|
| 6,320,809 | B1 | 11/2001 | Raad |
| 6,894,544 | B2 | 5/2005 | Gubbins |
| 7,450,359 | B1 | 11/2008 | Mei et al. |
| 8,058,910 | B1 | 11/2011 | Wright |
| 8,253,453 | B2 | 8/2012 | Vilas Boas et al. |
| 8,766,679 | B1 | 7/2014 | Paek et al. |
| 9,490,796 | B2 * | 11/2016 | Mandal ................ H03K 17/223 |
| 9,508,398 | B1 | 11/2016 | Shin et al. |
| 9,729,138 | B1 | 8/2017 | Gonzales et al. |
| 9,991,886 | B2 | 6/2018 | Subramanian et al. |
| 11,397,199 | B2 * | 7/2022 | Lim .......................... G06F 1/24 |
| 2005/0140405 | A1 | 6/2005 | Do et al. |
| 2019/0279687 | A1 | 9/2019 | Lee |
| 2020/0220535 | A1 | 7/2020 | Kawashima |

\* cited by examiner

SUPPLY VOLTAGE DETECTING CIRCUIT, METHOD OF OPERATING THE SAME, ELECTRONIC DEVICE COMPRISING THE SAME AND ELECTRONIC SYSTEM COMPRISING THE SAME

CROSS-REFERENCE TO RELATED APPLICATION

This U.S. non-provisional application is a continuation of and claims the benefit of priority under 35 U.S.C. §§ 120/121 to U.S. patent application Ser. No. 17/036,394, filed on Sep. 29, 2020, now U.S. Pat. No. 11,397,199, which claims the benefit of priority under 35 U.S.C. § 119 to Korean Patent Application No. 10-2020-0011346, filed on Jan. 30, 2020, in the Korean Intellectual Property Office, the contents of each of which are incorporated herein in their entirety by reference.

BACKGROUND

Various example embodiments of the inventive concepts relate to a supply voltage detecting circuit, an electronic device and an electronic system including the supply voltage detecting circuit, and/or a method of operating the supply voltage detecting circuit, and more particularly, to a supply voltage detecting circuit that detects whether or not a supply voltage applied to an electronic device reaches a certain level, a method of operating the supply voltage detecting circuit, and/or an electronic device including the supply voltage detecting circuit.

An electronic device may receive a supply voltage to drive intellectual property (IP) (e.g., IP blocks) of various types included in the electronic device, such as a micro controller unit (MCU) or a central processing unit (CPU), etc. A supply voltage may vary due to various causes such as instability of a power supply, and an electronic device may apply a supply voltage to IP only when a power supply stably outputs a supply voltage. Due to this, a reference circuit such as a bandgap reference (BGR) circuit has been used in the related art, but power consumption may increase due to the BGR circuit, and it is difficult to decrease the physical size and/or miniaturize an electronic device due to an increase in a volume caused by the inclusion of the BGR circuit. In addition, there is a problem in that the accuracy of detecting that a power supply stably outputs a supply voltage is reduced if a BGR circuit is not used.

SUMMARY

Various example embodiments of the inventive concepts provide for a supply voltage detecting circuit that reduces power consumption, may be miniaturized, and has high detection accuracy without using a reference circuit (e.g., a BGR circuit), a method of operating the supply voltage detecting circuit, and/or an electronic device and an electronic system including the supply voltage detecting circuit.

According to at least one example embodiment of the inventive concepts, there is provided an electronic device including circuitry configured to output a first output signal shifting to a logic high level at a first time in response to a supply voltage reaching a first voltage level, output a second output signal shifting to a logic high level at a second time occurring after the first time in response to the supply voltage reaching a second level higher than the first level, and the circuitry including an AND gate circuit configured to output a reset signal based on the first output signal and the second output signal.

According to at least one example embodiment of the inventive concepts, there is provided a supply voltage detecting circuit including trim resistance circuitry including an input terminal, an output terminal, and a plurality of trim resistors connected to each other in series, the input terminal configured to receive a supply voltage, a first transistor having a first source/drain terminal electrically connected to the output terminal, a plurality of trim switches that each have first ends connected between the plurality of trim resistors, have second ends connected to a gate terminal of the first transistor, and each of the plurality of trim switches are configured to perform a switching operation in response to a switching control signal, and a switch controller configured to provide the switching control signal for turning on a first trim switch of the plurality of trim switches based on a process variation of the first transistor when the supply voltage reaches a stable level, and the first trim switch configured to apply a voltage dropped by at least some of the plurality of trim resistors from the supply voltage to the gate terminal of the first transistor in response to being turned on.

According to at least one example embodiment of the inventive concepts, there is provided an electronic system including a supply voltage detecting circuit configured to a supply voltage detecting circuit configured to output a first output signal shifting to a logic high level at a first time in response to a supply voltage reaching a first voltage level, output a second output signal shifting to a logic high level at a second time after the first time in response to the supply voltage reaching a second level higher than the first level, and output a reset signal of a logic high level based on the first output signal and the second output signal, and at least one intellectual property (IP) block configured to operate based on the supply voltage and the reset signal.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Hereinafter, example embodiments of the inventive concepts will be described in detail with reference to the accompanying drawings.

Figure 1:
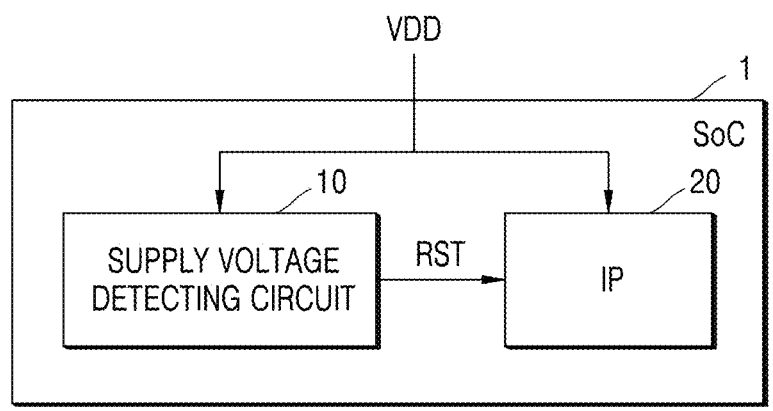
FIG. 1 is a diagram illustrating an electronic system 1 according to at least one example embodiment of the inventive concepts.

FIG. 1 is a diagram illustrating an electronic system 1 according to at least one example embodiment of the inventive concepts. For example, the electronic system 1 may include a system-on-chip (SoC), but is not limited thereto and may include other constituent elements.

Referring to FIG. 1, the electronic system 1 may operate when a supply voltage VDD is applied thereto. For example, the electronic system 1 may perform an electrical operation according to a desired and/or preset circuit design, based on the applied supply voltage VDD. The electronic system 1 may include a supply voltage detecting circuit 10 and/or intellectual property (IP) 20, but is not limited thereto, and for example, may include a plurality of IP blocks, at least one communication bus, a display, a battery, etc.

The supply voltage detecting circuit 10 may detect a level of the supply voltage VDD that may normally operate the electronic system 1 and/or the IP 20. When the supply voltage VDD of a level (e.g., voltage level) capable of operating the electronic system 1 and/or the IP 20 is applied, the supply voltage detecting circuit 10 may output a reset signal RST of a logic high level to the IP 20. In other words, the logic high level of the reset signal RST may indicate an operation start (e.g., may enable and/or cause the start of an operation, etc.) of the IP 20, and a logic low level of the reset signal RST may block the operation start of the IP 20 (e.g., may stop, disable, and/or end an operation, etc.) even when a level of the supply voltage VDD is increased, but the example embodiments are not limited thereto. For example, even when the supply voltage VDD of a specific level is applied, the IP 20 may not start an operation when the reset signal RST of a logic low level is applied. In contrast to this, when the supply voltage VDD of a specific level and the reset signal RST of a logic high level are applied, the IP 20 may start an electrical operation based on the supply voltage VDD, etc.

The IP 20 may have various types of electronic configurations in which the supply voltage VDD is required to perform an electrical operation. For example, the IP 20 may include at least one of an application processor (AP), a central processing unit (CPU), a micro controller unit (MCU), a memory controller, a memory device, and/or a graphics processing unit (GPU), etc., but the example embodiments are not limited thereto. When the reset signal RST of a logic high level is applied together with the supply voltage VDD, the IP 20 may perform a reset operation, which is a preparation operation for performing an electrical operation, and thereafter, an electrical operation of the IP 20 according to a circuit design may be performed based on the power supplied by the supply voltage VDD, but the example embodiments are not limited thereto.

According to at least one example embodiment of the inventive concepts, the supply voltage detecting circuit 10 may include a first transistor that receives a voltage based on the supply voltage VDD. The first transistor may be configured to output the reset signal RST of a logic high level when and/or in response to the supply voltage VDD reaches a certain level (for example, a stable level, a stable threshold level, etc.). In this case, a turn-on voltage (for example, a gate-source voltage) of the first transistor may change depending on a manufacturing process, and different supply voltage detecting circuits 10 may detect different voltage levels as stable levels depending on a process variation of the first transistor. Accordingly, the supply voltage detecting circuit 10 according to at least one example embodiment of the inventive concepts may be configured so that the first transistor is turned on by a constant level of the supply voltage VDD, and details will be described below.

According to at least one example embodiment of the inventive concepts, the supply voltage detecting circuit 10 may turn the first transistor on or off based on a first enable signal, e.g., when the first enable signal is at a logic high level, but the example embodiments are not limited thereto, and in other the first transistor may be toggled based on a logic low level, etc. For example, the supply voltage detecting circuit 10 may include a plurality of trim switches for operating the first transistor, and the plurality of trim switches may be turned on or off based on the first enable signal. For example, the first enable signal may be shifted to a logic high level when the supply voltage VDD reaches a sufficiently high level, etc. In addition, the supply voltage detecting circuit 10 may decrease and/or prevent a circuit from abnormally operating due to instability of the first enable signal by feeding back an output signal (for example, OUT2 in FIG. 4).

According to at least one example embodiment of the inventive concepts, the supply voltage detecting circuit 10 precisely tracks the supply voltage VDD in a process in which a level of the supply voltage VDD is increased or reduced, thereby providing a good quality (e.g., reliable, stable, etc.) reset signal RST. Accordingly, the supply voltage detecting circuit 10 may stably operate the electronic system 1.

Figure 2:
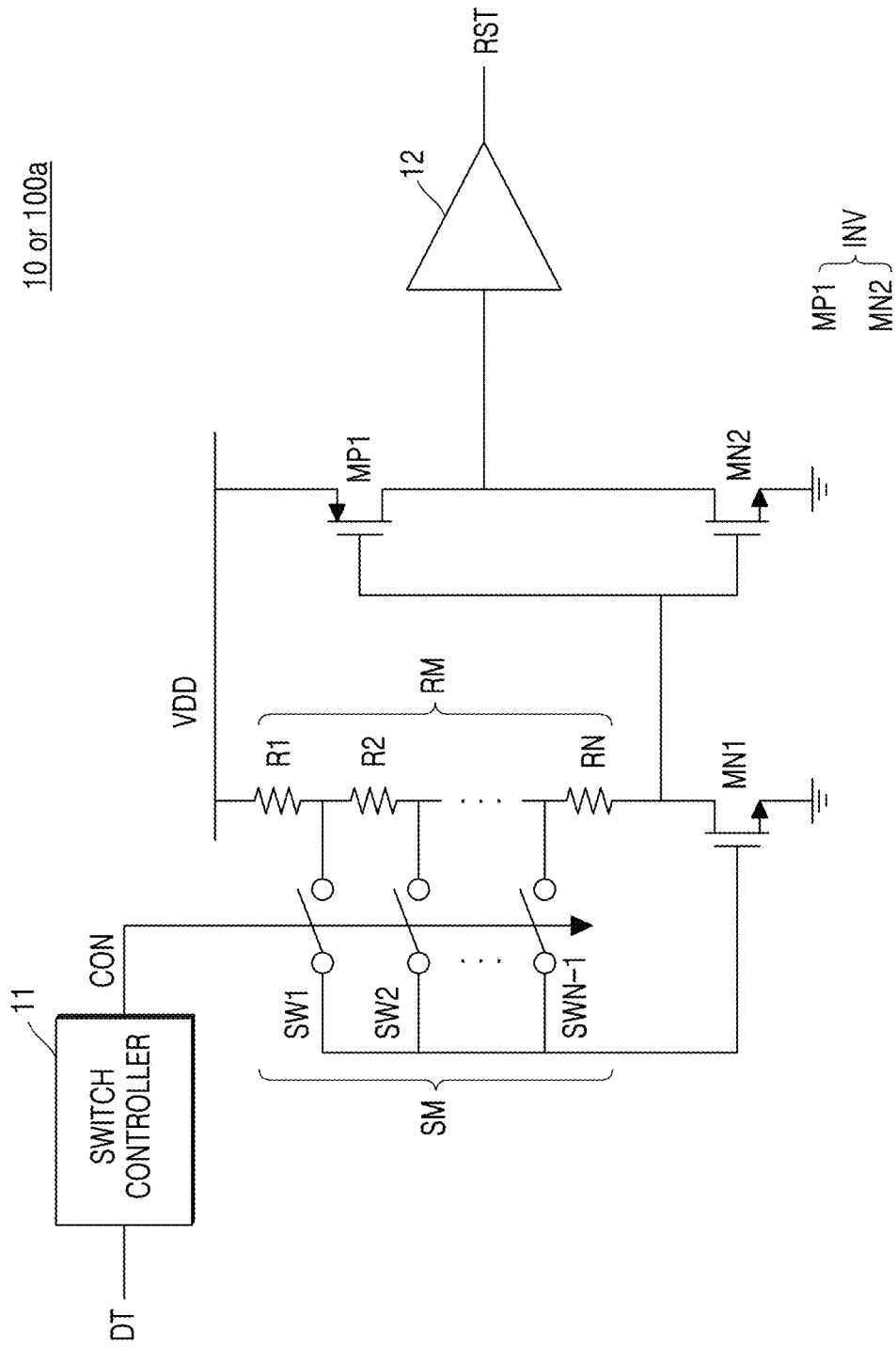
FIG. 2 is a circuit diagram illustrating a first detecting circuit according to at least one example embodiment of the inventive concepts.

FIG. 2 is a circuit diagram illustrating a first detecting circuit according to at least one example embodiment of the inventive concepts.

Referring to FIG. 2, a first detecting circuit 100a may include a switch controller 11, a trim switch module SM, a trim resistance module RM, a first transistor MN1, an inverter INV, and may further include a buffer 12, etc., but the example embodiments are not limited thereto, and the example embodiments may include a greater or lesser number of constituent components. The trim switch module SM may include a plurality of trim switches SW1 to SWN−1, the trim resistance module RM may include a plurality of trim resistors R1 to RN, and the inverter INV may include a plurality of transistors MP1 and MN2, but the example embodiments are not limited thereto and there may be a greater or lesser number of components than shown. The supply voltage detecting circuit 10 may include the first detecting circuit 100a as an example, and the first detecting circuit 100a may be implemented as the supply voltage detecting circuit 10 as another example, but are not limited thereto.

According to at least one example embodiment of the inventive concepts, as the supply voltage VDD increases, the switch controller 11 may turn on at least one of the plurality of trim switches SW1 to SWN−1 based on switch selection data DT. The switch selection data DT may indicate one switch (for example, SW1) among the plurality of switches SW1 to SWN−1 according to a process variation of the first transistor MN1. For example, the switch selection data DT may be data stored in a storage unit included in at least one of the electronic system 1, the supply voltage detecting circuit 10, and the first detecting circuit 100a, and may be binary code data indicating the one switch (for example, SW1), but is not limited thereto.

According to at least one example embodiment of the inventive concepts, the switch selection data DT may be data for determining at least one of the plurality of trim switches, based on a process variation of the first transistor MN1. That is, the switch controller 11 may be configured to apply different voltage levels to a gate terminal of the first transistor MN1 according to a process variation of the first transistor MN1. For example, the process variation may include a switching speed of the first transistor MN1, but is not limited thereto. As one example, a fast switching speed of the first transistor MN1 may indicate that the first transistor MN1 may be turned on even when a voltage (for example, a gate-source voltage) of a relatively low level is applied to the gate terminal of the first transistor MN1. In other words, when a threshold voltage of the first transistor MN1 is low, the first transistor MN1 may be expressed as having a fast switching speed. As another example, a slow switching speed of the first transistor MN1 may indicate that the first transistor MN1 may be turned on when a voltage (for example, the gate-source voltage) of a relatively high level is applied to the gate terminal of the first transistor MN1. In other words, when the threshold voltage of the first transistor MN1 is high, the first transistor MN1 may be expressed as having a slow switching speed.

When the reset signal RST is output according to different levels of the supply voltage VDD based on the process variation of the first transistor MN1, although the supply voltage VDD is applied in the same situation, the electronic system 1 and/or the IP 20 may be destabilized.

According to at least one example embodiment of the inventive concepts, the switch controller 11 may control a switching operation of at least one of the plurality of trim switches SW1 to SWN-1 by transmitting a switching control signal CON based on the switch selection data DT. That is, the switching control signal CON may be an electrical signal for turning on at least one trim switch (for example, SW1) based on the switch selection data DT. According to some example embodiments, the switch controller 11 may include hardware such as logic circuits (e.g., processing circuitry, etc.); a hardware/software combination such as at least one processor core executing software and/or executing any instruction set; or a combination thereof. For example, the switch controller 11 more specifically may include, but is not limited to, a field programmable gate array (FPGA), a programmable logic unit, an application-specific integrated circuit (ASIC), etc.

According to at least one example embodiment of the inventive concepts, a level of the supply voltage VDD may be increased to a stable level so that the electronic system 1 is stably driven. In other words, the level of the supply voltage VDD may be increased such that the supply voltage VDD is above, or equal to, a desired voltage level corresponding to the stable level (e.g., the supply voltage VDD is increased to be above or equal to a voltage sufficient to drive the IP 20, etc.), and/or the supply voltage VDD is within a desired tolerance range of the desired voltage level (e.g., +/−5% of the desired voltage level, above a cutoff voltage where the supply voltage VDD cannot drive the IP 20, etc.). Additionally, in some example embodiments, the stable level may refer to the supply voltage VDD being increased (or decreased) so that the supply voltage VDD is a constant voltage level for a desired period of time, or in other words, the supply voltage VDD does not fluctuate. In this case, the switch controller 11 may apply a voltage of a lower level to the gate terminal of the first transistor MN1 as the switching speed of the first transistor MN1 is higher (as compared to a desired reference switching speed, or in other words the switching speed may be a first speed, etc.). To this end, the switch controller 11 may turn on at least one of the plurality of trim switches SW1 to SWN−1. That is, the switch controller 11 may control the trim switch module SM.

According to at least one example embodiment of the inventive concepts, the switch controller 11 may turn on a first trim switch SW1 when the switching speed of the first transistor MN1 has a first value, but is not limited thereto. When the first trim switch SW1 is turned on, a voltage of a third level may be applied to the gate terminal of the first transistor MN1. The voltage of the third level may have a level of a voltage dropped by the first trim resistor R1 from the level of the supply voltage VDD, but the example embodiments are not limited thereto.

According to at least one other example embodiment of the inventive concepts, the switch controller 11 may turn on a second trim switch SW2 when the switching speed of the first transistor MN1 has a second value higher than the first value. When the second trim switch SW2 is turned on, a voltage of a fourth level voltage lower than the third level may be applied to the gate terminal of the first transistor MN1, but the example embodiments are not limited thereto. The voltage of the fourth level may have a level of a voltage dropped by the first trim resistor R1 and the second trim resistor R2 from the level of the supply voltage VDD. Accordingly, as the switching speed of the first transistor MN1 increases (or is higher), the switch controller 11 may control the switch module SM so that a combined resistance value of the plurality of trim resistors R1 to RN between one end of the first trim switch and an input terminal to which the supply voltage VDD is applied is increased, but the example embodiments are not limited thereto.

According to at least one example embodiment of the inventive concepts, a level of the supply voltage VDD may be reduced to a cutoff level (e.g., a second threshold level, disabling threshold level, etc.) at which the electronic system 1 needs to stop an electrical operation. In this case, the switch controller 11 may turn off at least one of the plurality of trim switches SW1 to SWN−1 determined according to the switching speed of the first transistor MN1. Because a turn-on operation is turned off in the above description, detailed description will be omitted.

According to at least one example embodiment of the inventive concepts, the trim resistance module RM may further include an input terminal to which the supply voltage VDD is applied, and an output terminal connected to the first transistor MN1 and the inverter INV, but the example embodiments are not limited thereto. The trim resistance module RM may include a plurality of trim resistors R1 to RN connected in series, but is not limited thereto. A first source/drain terminal of the first transistor MN1 may be connected to the output terminal of the resistance module RM, a second source/drain terminal may be grounded, and the gate terminal may be connected to the plurality of trim switches SW1 to SWN−1. Each of the plurality of trim switches SW1 to SWN−1 may be connected between the plurality of trim resistors R1 to RN, but the example embodiments are not limited thereto. That is, one end of each of the plurality of trim switches SW1 to SWN−1 may be connected between two of the plurality of trim resistors R1 to RN, and the other end of each of the plurality of trim switches SW1 to SWN−1 may be connected to the gate terminal of the first transistor MN1. The plurality of trim switches SW1 to SWN−1 may perform a switching operation (e.g., a turn-on operation or a turn-off operation, a toggle operation, etc.) in response to and/or based on the switching control signal CON. When the supply voltage VDD reaches a stable level, the switch controller 11 may turn on the first trim switch by providing the switching control signal CON. The first trim switch may be one of the plurality of trim switches SW1 to SWN−1 and may be determined based on a process variation of the first transistor MN1. A voltage, which is dropped by at least some of the plurality of trim resistors R1 to RN, from the supply voltage VDD may be applied to the gate terminal of the first transistor MN1.

According to at least one example embodiment of the inventive concepts, when the supply voltage VDD is increased to a stable level, the turned-on first transistor MN1 may apply a voltage of a ground level to the inverter INV. The inverter INV may output the reset signal RST of a logic high level, but is not limited thereto. In some cases, the buffer 12 may output the reset signal RST of a logic high level, based on a voltage of a logic high level received from the inverter INV. When the supply voltage VDD increases, the first detecting circuit 100a may output the reset signal RST of a logic high level at a constant level (that is, a stable level) regardless of a process variation of the first transistor MN1. Accordingly, the IP 20 may be reset by the supply voltage VDD of a constant level.

According to at least one example embodiment of the inventive concepts, a current path may not be formed from an input terminal to which the supply voltage VDD is applied, to an input terminal of the inverter INV in a situation in which the first transistor MN1 is turned off, or in other words, the input terminal of the inverter INV is not supplied with the supply voltage VDD when the first transistor MN1 is turned off, but the example embodiments are not limited thereto. Accordingly, a voltage drop (or IR drop) according to the trim resistors R1 to RN does not occur, and thus, the detection accuracy of the supply voltage VDD may be increased. Furthermore, when a resistance value of a switch is high, a leakage current of the switch itself is generated, and thus, the switch may be designed to be large in general. However, according to at least one example embodiment of the inventive concepts, because the plurality of trim switches SW1 to SWN−1 are connected to the gate terminal of the first transistor MN1, a current passing through the trim switches SW1 to SWN−1 is not generated, and thus, the trim switches SW1 to SWN−1 may be physically smaller and/or miniaturized. That is, the supply voltage detecting circuit 10 may be miniaturized and/or made smaller than a conventional supply voltage detecting circuit, and the electronic device 1 may be miniaturized and/or made smaller than a conventional electronic device using a conventional supply voltage detecting circuit.

Figure 3:
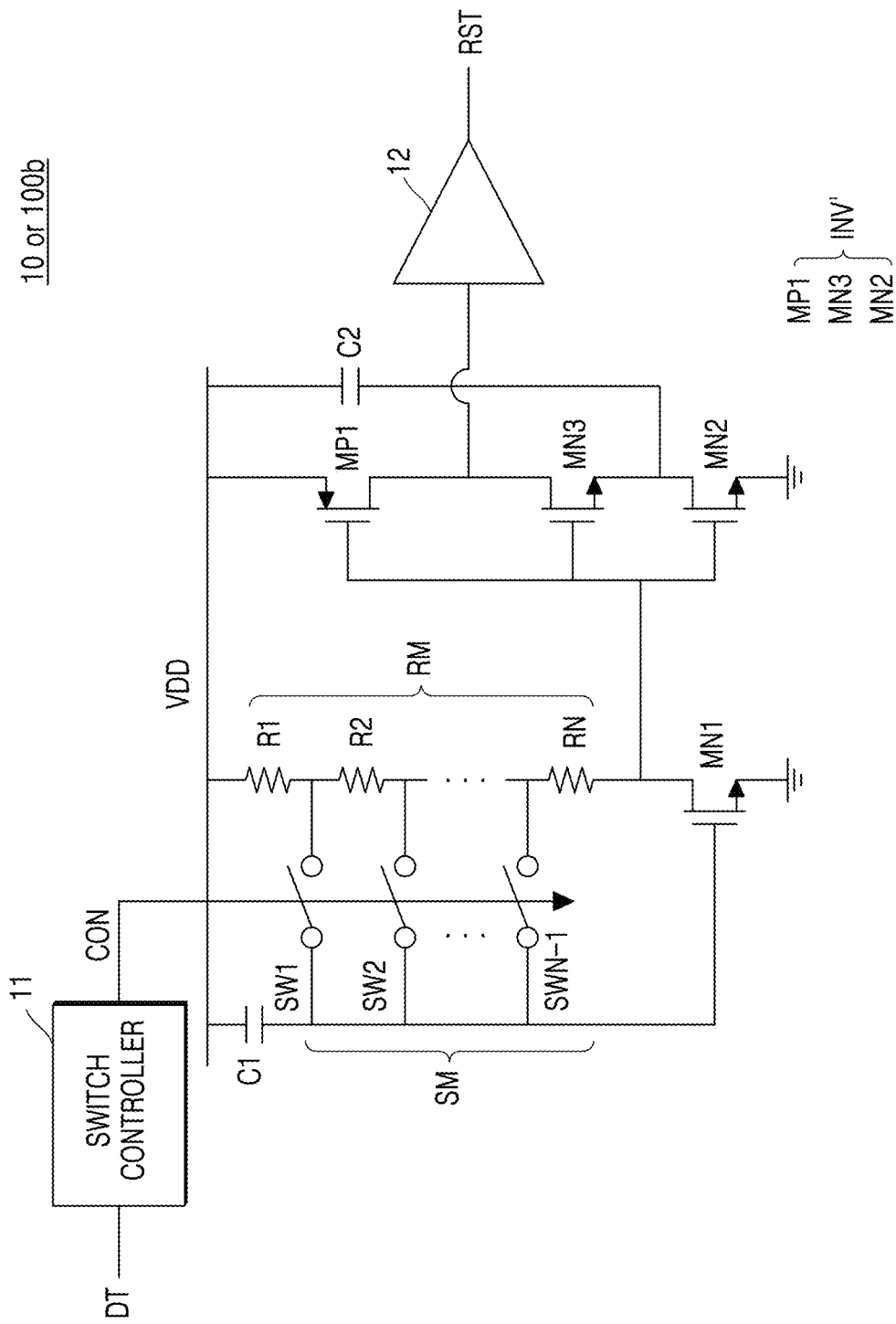
FIG. 3 is a circuit diagram illustrating a first detecting circuit according to another example embodiment of the inventive concepts.

FIG. 3 is a circuit diagram illustrating the first detecting circuit according to another example embodiment of the inventive concepts.

Referring to FIG. 3, a first detecting circuit 100b may include the switch controller 11, the trim switch module SM, the trim resistance module RM, the first transistor MN1, an inverter INV', and/or the buffer 12, etc., but is not limited thereto. For example, the first detecting circuit 100b may further include a first capacitor C1, a second capacitor C2, and a second transistor MN2, etc. Descriptions previously given with respect to FIG. 2 will be omitted.

According to at least one example embodiment of the inventive concepts, one end of the first capacitor C1 may be connected to an input terminal to which the supply voltage VDD is applied, and the other end of the first capacitor C1 may be connected to the plurality of trim switches SW1 to SWN−1. That is, the first capacitor C1 may be electrically connected to the input terminal and the other end of the plurality of trim switches SW1 to SWN−1, but the example embodiments are not limited thereto. For example, the first capacitor C1 may rapidly apply a level of the reducing supply voltage VDD to the gate terminal of the first transistor MN1, etc. That is, the gate terminal of the first transistor MN1 may rapidly receive the supply voltage VDD of which the voltage level is changed and/or changing.

According to at least one example embodiment of the inventive concepts, the inverter INV' may receive a first voltage provided to the first source/drain terminal of the first transistor MN1. That is, the inverter INV may receive the first voltage at a node connected to the resistance module RM and the first transistor MN1. The inverter INV' may invert the applied first voltage and output the inverted first voltage to the buffer 12, and the buffer 12 may output the reset signal RST based on the first voltage, but the example embodiments are not limited thereto. As another example, the inverter INV' may output the received first voltage as the reset signal RST. In this case, the inverter INV may include the second transistor MN2, and the third source/drain terminal of the second transistor MN2 may be electrically connected to the second capacitor C2. That is, the ends of the second capacitor C2 may be connected to the second transistor MN2 and the input terminal to which the supply voltage VDD is applied, respectively, but are not limited thereto. The second capacitor C2 may reduce a voltage of a source terminal of the third transistor MN3 in a situation in which the supply voltage VDD is reduced. That is, a gate-source voltage of the third transistor MN3 may be reduced, and thus, the inverter INV' may rapidly output the reset signal RST of a logic low level based on the first voltage of a logic high level which is input to the inverter INV', and thus, the IP 20 may be rapidly turned off.

Figure 4:
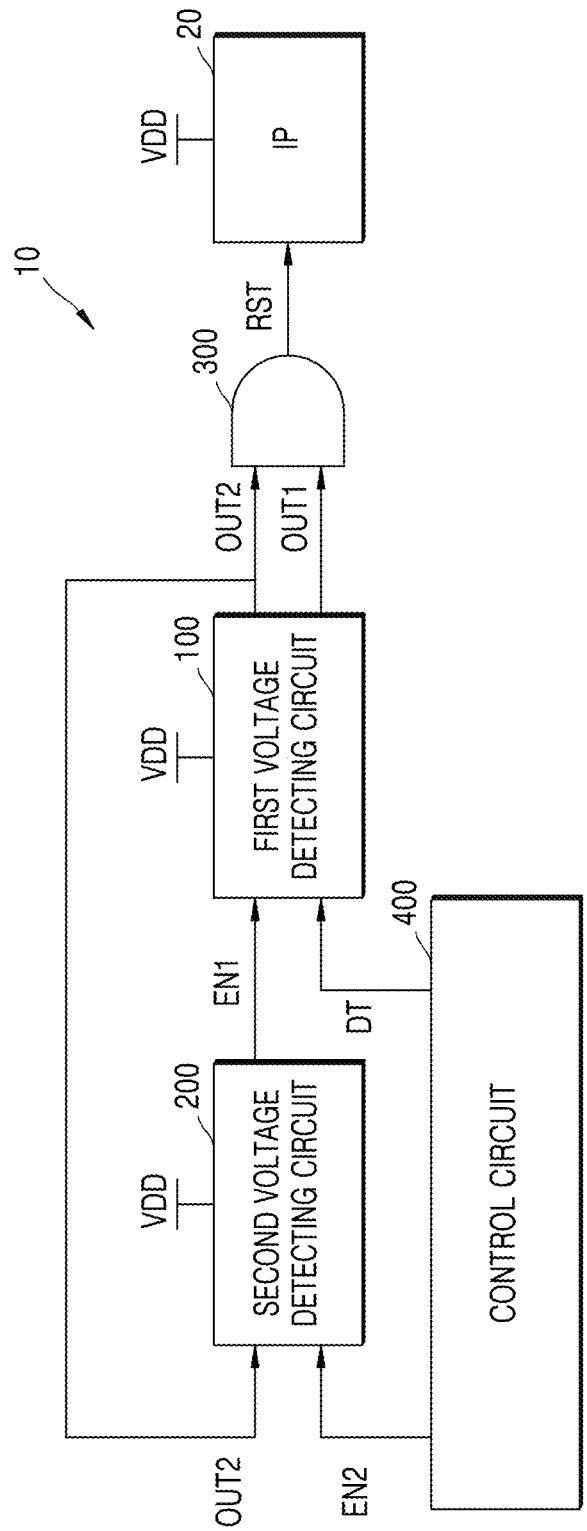
FIG. 4 is a block diagram illustrating a supply voltage detecting circuit according to at least one example embodiment of the inventive concepts.

FIG. 4 is a block diagram illustrating a supply voltage detecting circuit according to at least one example embodiment of the inventive concepts.

Referring to FIG. 4, the supply voltage detecting circuit 10 may include a first voltage detecting circuit 100, a second voltage detecting circuit 200, an AND gate circuit 300, and/or a control circuit 400, etc., and the supply voltage detecting circuit 10 may transmit the reset signal RST to the IP 20. The first voltage detecting circuit 100 may be configured to include at least one of the first voltage detecting circuits 100, 100a, and 100b described above with reference to FIGS. 1 to 3, but the example embodiments are not limited thereto.

According to at least one example embodiment of the inventive concepts, when a level of the supply voltage VDD increases to reach a stable level (e.g., a second level, etc.), the supply voltage detecting circuit 10 may output the reset signal RST of a logic high level, and when the level of the supply voltage VDD is reduced to reach a cutoff level (e.g., a first level, etc.), the supply voltage detecting circuit 10 may output the reset signal RST of a logic low level. The stable level of the supply voltage VDD may indicate a level of the supply voltage VDD in which the IP 20 may stably operate. The cutoff level of the supply voltage VDD may indicate a level of the supply voltage VDD in which the supply voltage VDD is not sufficient to drive the IP 20.

According to at least one example embodiment of the inventive concepts, the first voltage detecting circuit 100 may receive the supply voltage VDD and may detect a change in a level of the supply voltage VDD. For example, the first voltage detecting circuit 100 may output first output and second output signals OUT1 and OUT2 having a rising slope in response to the supply voltage VDD having a rising slope. In this case, the second output signal OUT2 may rise later (and/or slower) than the first output signal OUT1. In other words, the second output signal OUT2 may have a delayed rising slope more than the rising slope of the first output signal OUT1, but the example embodiments are not limited thereto.

According to at least one example embodiment of the inventive concepts, the AND gate circuit 300 may perform an AND operation on the first output signal OUT1 and the second output signal OUT2, and output the reset signal RST. For example, when both the first output signal OUT1 and the second output signal OUT2 have a logic high level, the AND gate circuit 300 may output the reset signal RST of a logic high level to the IP 20.

According to at least one example embodiment of the inventive concepts, the first voltage detecting circuit 100 may start to detect the supply voltage VDD based on a first enable signal EN1, but the example embodiments are not limited thereto. In addition, as described above with reference to FIGS. 1 to 3, the first voltage detecting circuit 100 may select at least one of the plurality of trim switches SW1 to SWN−1 included in the first voltage detecting circuit 100 based on the switch selection data DT. The second voltage detecting circuit 200 may turn on or off (e.g., toggle) the selected one trim switch based on a second enable signal EN2. For example, the second voltage detecting circuit 200 may not control the remaining trim switches that are not selected, but is not limited to this.

According to at least one example embodiment of the inventive concepts, the second voltage detecting circuit 200 may receive feedback of a second output signal OUT2, and may output the first enable signal EN1 based on the second output signal OUT2 and the second enable signal EN2, but the example embodiments are not limited thereto.

According to at least one example embodiment of the inventive concepts, the control circuit 400 may output the second enable signal EN2 of a logic high level in response to the supply voltage VDD reaching the stable level. For example, the second enable signal EN2 may be a toggle signal having a logic high level for a desired and/or preset time. In addition, the control circuit 400 may output the switch selection data DT for selecting or indicating one of the plurality of trim switches SW1 to SWN−1. For example, the control circuit 400 may receive the switch selection data DT from a storage unit (e.g., storage device, memory, memory device, etc.) included inside or outside the supply voltage detecting circuit 10, thereby outputting the switch selection data DT to the first voltage detecting circuit 100.

Figure 5:
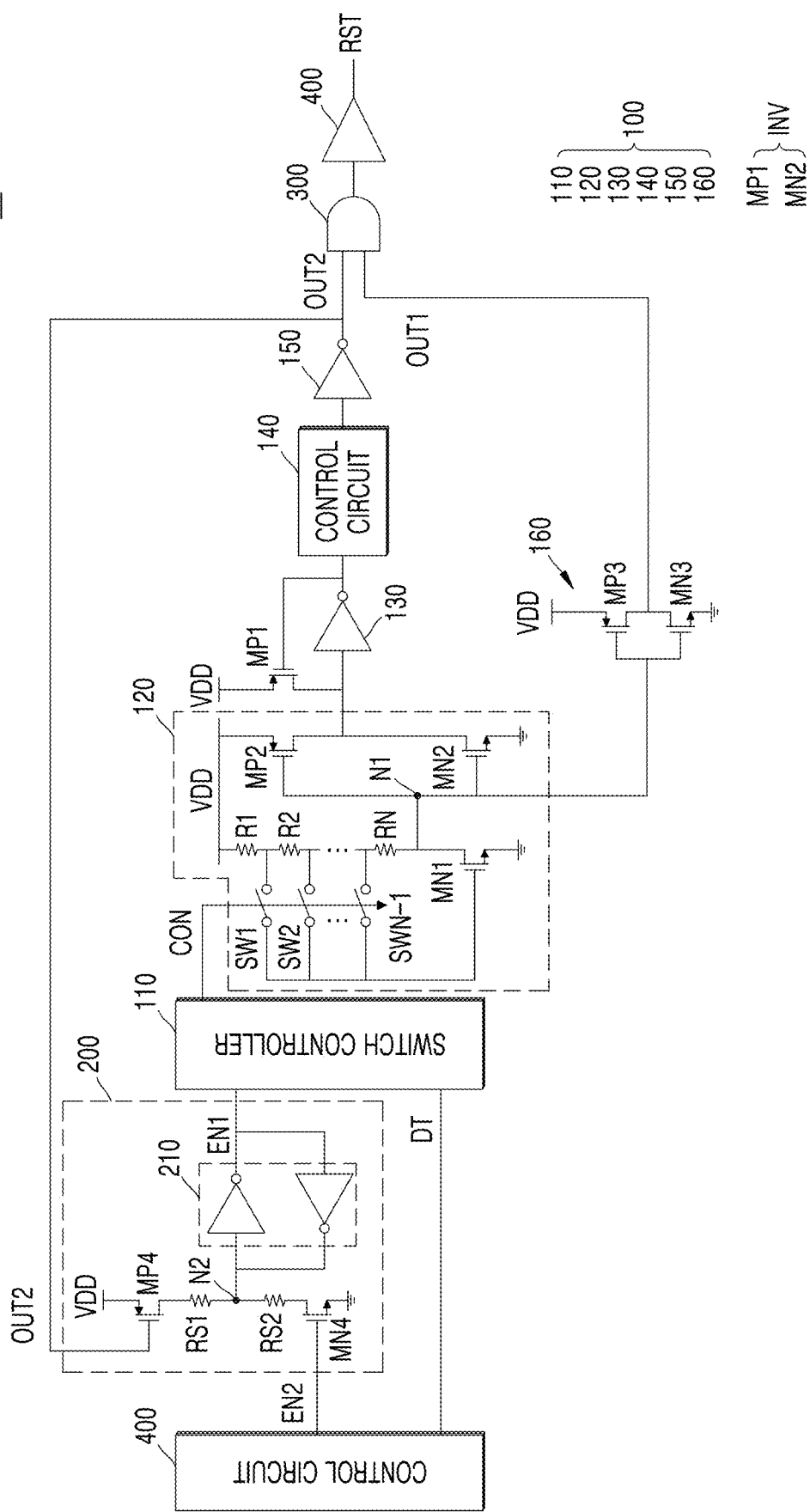
FIG. 5 is a circuit diagram of a supply voltage detecting circuit according to at least one example embodiment of the inventive concepts.
Figure 6:
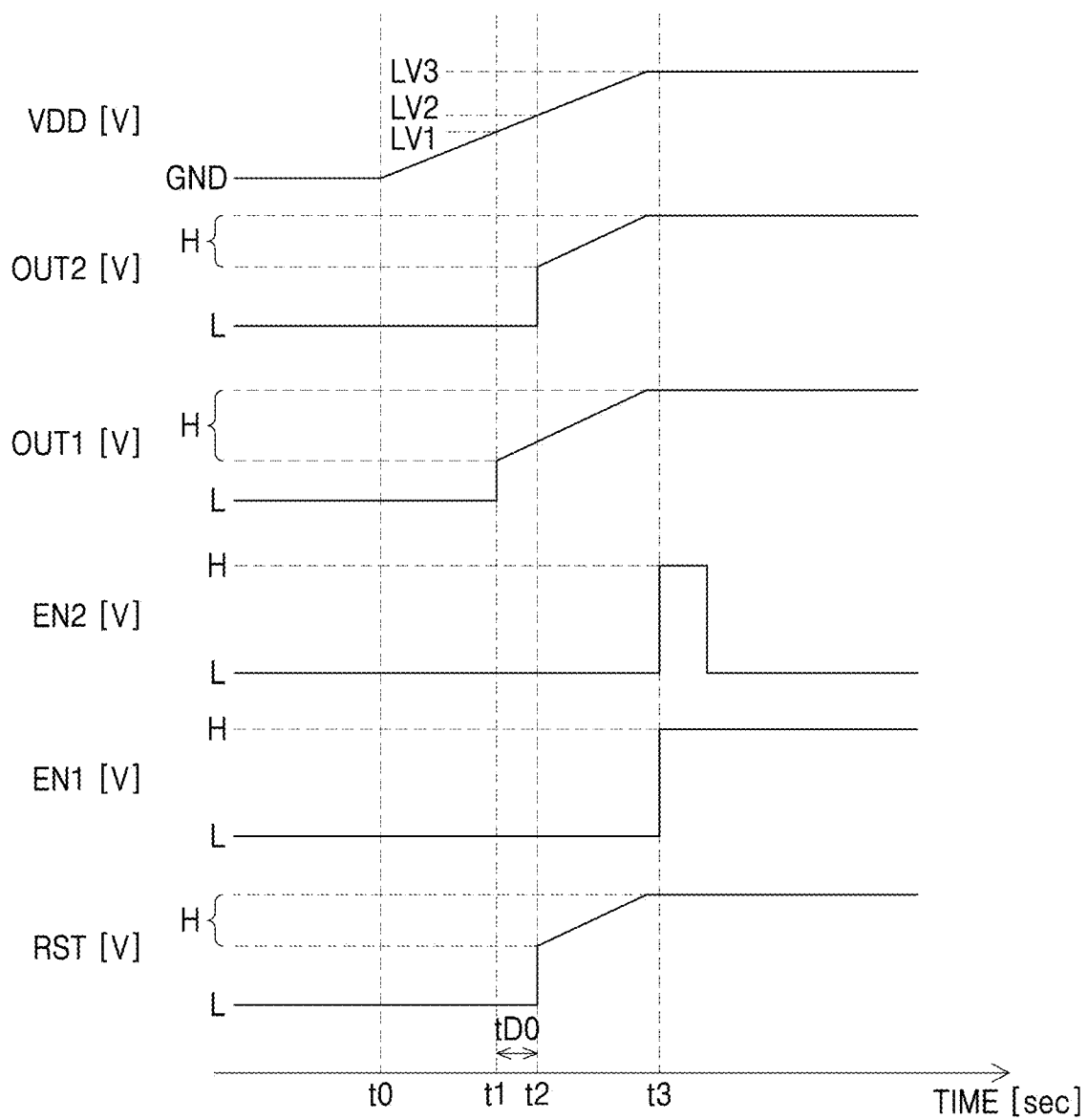
FIG. 6 is a waveform diagram of a supply voltage detecting circuit according to at least one example embodiment of the inventive concepts.

FIG. 5 is a circuit diagram of a supply voltage detecting circuit according to at least one example embodiment of the inventive concepts, and FIG. 6 is a waveform diagram of the supply voltage detecting circuit according to at least one example embodiment of the inventive concepts.

Referring to FIG. 5, the first detecting circuit 100 may include a switch controller 110, a core circuit 120, a plurality of inverters 130, 150, and 160, a delay circuit 140, and/or a buffer 400, etc., and the second detecting circuit 200 may further include a latch circuit 210, etc., but the example embodiments are not limited thereto. Detailed configuration and operation of the core circuit 120 are similar to the configuration and operation described above with reference to FIGS. 1 to 4, and thus, description thereof will be omitted.

Referring to FIGS. 5 and 6, before time t0, the electronic system 1 may be before driving (e.g., the electronic system 1 may be turned off, etc.). In other words, a level of the supply voltage VDD applied to the supply voltage detecting circuit 10 and the IP 20 may be a ground level GND or 0V, etc. Since the supply voltage VDD is not applied to the supply voltage detecting circuit 10, internal voltages (for example, OUT1) of the supply voltage detecting circuit 10 or a voltage (for example, RST) output to the outside (e.g., output externally) will not be generated. For example, a voltage at an internal node of the supply voltage detecting circuit 10 may be a logic low level L, the ground level GND, or 0V, etc.

According to at least one example embodiment of the inventive concepts, from time t0 to time t1, the first voltage detecting circuit 10 may receive the supply voltage VDD having a rising slope. That is, the supply voltage VDD may rise from the ground level GND to a first level LV0. In this case, the supply voltage VDD is lower than a decision level (e.g., desired threshold level) of the transistors or switches included in the supply voltage detecting circuit 10, and thus, the plurality of voltages or signals OUT1, OUT2, EN1, EN2, and RST may have the logic low level L.

According to at least one example embodiment of the inventive concepts, the first output signal OUT1 may have a rising edge at the time t1. The core circuit 120 may apply the supply voltage VDD to a first node N1, and the first transistor MN1 may be in a turn-off state. The transistor MP3 of the inverter 160 may be turned on at a first level LV1. Accordingly, the inverter 160 may output the applied supply voltage VDD as the first output signal OUT1. Furthermore, the transistor MP2 of the inverter INV may be turned on at the first level LV1. Accordingly, the inverter INV may output the applied supply voltage VDD to an input terminal of the inverter 130. Thereafter, the inverter 130 may invert the supply voltage VDD of the first level LV1, and the delay circuit 140 may delay the inverted supply voltage VDD by a desired and/or preset time tD0. For example, the delay circuit 140 may be implemented as an RC delay circuit, but is not limited thereto. In addition, the inverter INV may invert a voltage output from the delay circuit 140 again, and output the second output signal OUT2. For example, the first output signal OUT1 may have a voltage obtained by inverting a voltage of the first node N1 once, and the second output signal OUT2 may have a voltage obtained by inverting the voltage of the first node N1 three times, but the example embodiments are not limited thereto. Accordingly, the first output signal OUT1 and the second output signal OUT2 may have the same rising slope, and the second output signal OUT2 may be delayed more than the first output signal OUT1 (e.g., the second output signal OUT2 is delayed for a desired period of time such that the second output signal OUT2 is output after the first output signal OUT1, etc.), but the example embodiments are not limited thereto. In other words, at the time t1, the first output signal OUT1 may have a rising edge, and at time t2, the second output signal OUT2 may have a rising edge, etc.

From the time t2 to time t3, the AND gate circuit 300 may output the reset signal RST of a logic high level H, based on the first output signal OUT1 and the second output signal OUT2 having the logic high level H. In other words, the supply voltage detecting circuit 10 may output the reset signal RST of the logic high level H in response to the supply voltage VDD of a stable level (e.g., a second level, etc.) LV2, but the example embodiments are not limited thereto.

Furthermore, the supply voltage VDD may reach a drive level LV3 at the time t3 or before, and the first output signal OUT1 and the second output signal OUT2 may maintain the logic high level according to a rise (e.g., increase) in the supply voltage VDD.

At the time t3, the control circuit 400 may output the second enable signal EN2 of the logic high level H, and as illustrated in FIG. 6, the second enable signal EN may be a toggle signal, but the example embodiments are not limited thereto. The control circuit 400 may detect the level of the supply voltage VDD reaching the drive level LV3 and shift (e.g., increase, etc.) the second enable signal EN2 to the logic high level H. That is, the control circuit 400 may output the second enable signal EN2 having a rising edge at the time t3, but is not limited thereto.

According to at least one example embodiment, the second voltage detecting circuit 200 may output the first enable signal EN1 having the logic high level H in response to the second enable signal EN2 of the logic high level H.

Referring to FIG. 5, the second voltage detecting circuit 200 may receive the second output signal OUT2 through a gate terminal, receive the supply voltage VDD through one end, and the other end may include a transistor MP4 connected to one end of the resistor RS1, but the example embodiments are not limited thereto. The other end of the resistor RS1 may be connected to one end of the resistor RS2 and an input terminal of the latch circuit 210. A transistor MN4 may receive the second enable signal EN2 through the gate terminal, one end of the transistor MN4 may be connected to the other end of the resistor RS2, and the other end of the transistor MN4 may be grounded, but the example embodiments are not limited thereto.

At the time t3, the transistor MN4 may be turned on when receiving the second enable signal EN2 of the logic high level H. Accordingly, a second node N2 may have a voltage of a ground level, 0V, or a logical level similar thereto. The latch circuit 210 may receive a voltage of the ground level and output the first enable signal EN1 of the logic high level H. The switch controller 110 may turn on at least one of the plurality of trim switches SW1 to SWN−1 determined by the switch selection signal DT in response to the first enable signal EN1 of the logic high level H.

An external power supply that applies the supply voltage VDD may apply a constant DC voltage (e.g., stable voltage, linear voltage, etc.) coinciding with a target level of the external power supply from the time t3 to time t4. The supply voltage detecting circuit 10 may continuously output the reset signal RST of the logic high level H from the time t3 to the time t4, and thus, the supply voltage detecting circuit 10 may notify the IP 20 through the reset signal RST that the supply voltage VDD applied to the IP 20 is in a normal state, but the example embodiments are not limited thereto.

Figure 7:
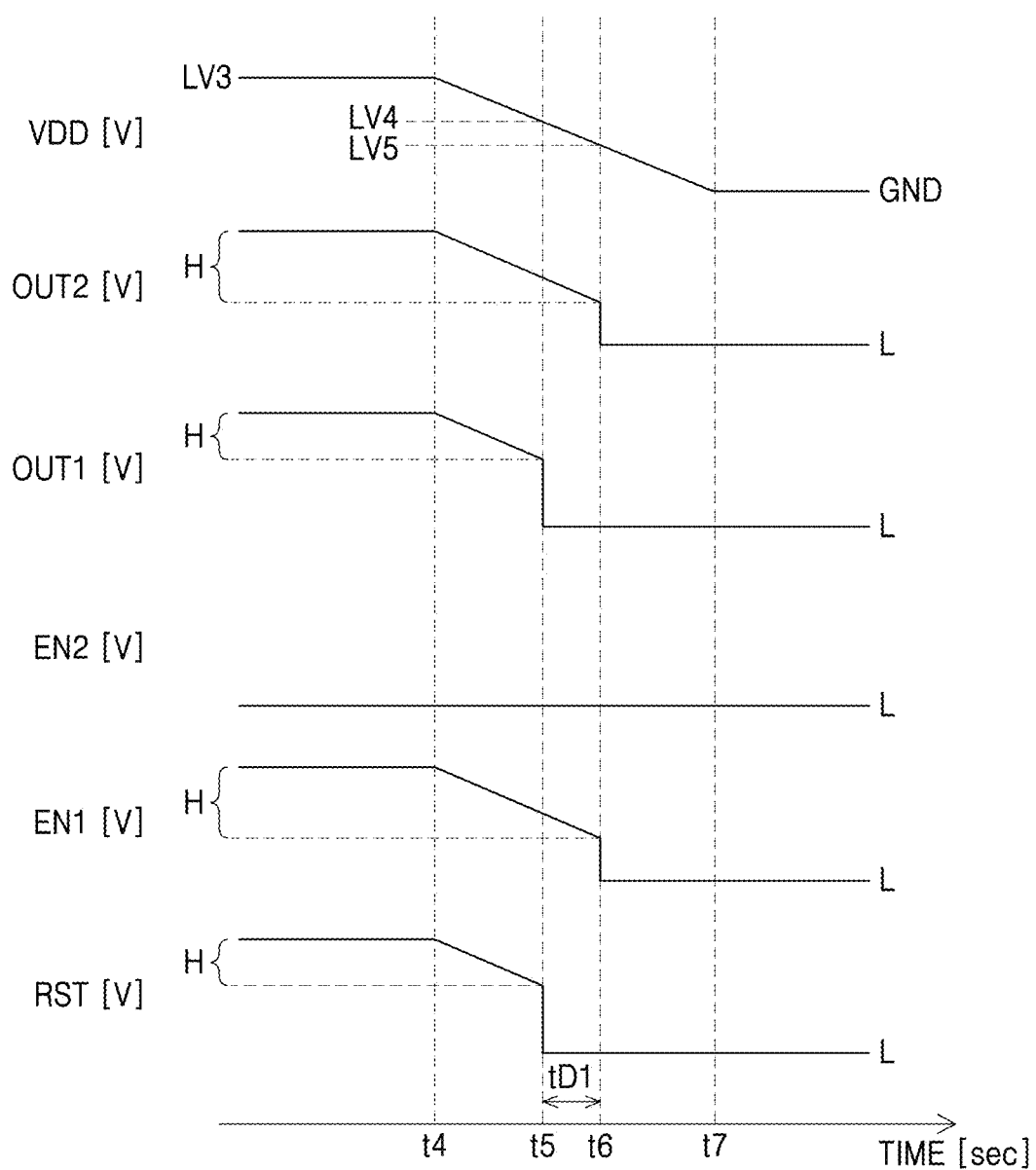
FIG. 7 is a waveform diagram of a supply voltage detecting circuit according to at least one example embodiment of the inventive concepts.

FIG. 7 is a waveform diagram of a supply voltage detecting circuit according to at least one example embodiment of the inventive concepts.

Referring to FIGS. 5 and 7, the supply voltage VDD may have a falling slope from the time t4 to time t5, but the example embodiments are not limited thereto. In this case, the first output signal OUT1 and the second output signal OUT2 that are output based on the supply voltage VDD may also have a falling slope. For example, as the supply voltage VDD applied to the core circuit 120 is reduced (e.g., the level of the supply voltage VDD decreases, etc.), a first voltage applied to the first node N1 may be reduced (the level of the first voltage decreases, etc.), and the first output signal OUT1 and the second output signal OUT2 may also be reduced based on the first voltage, which is reduced (e.g., the first output signal OUT1 and the second output signal OUT2 are correspondingly decreased based on the first voltage, etc.). The AND gate circuit 300 may output the reset signal RST having a falling slope based on the first and second output signals OUT1 and OUT2 having a falling slope, etc.

Furthermore, according to at least one example embodiment, the first enable signal EN1 may also have a falling slope based on the second output signal OUT2 having a falling slope (e.g., the first enable signal EN1 may be based on and/or correspond to the second output signal OUT2). For example, the second voltage detecting circuit 200 may maintain a turn-on state of the transistor MP4 based on the second output signal OUT2 having a falling slope, and the transistor MN4 may be turned off based on the second enable signal EN2 of a logic low level L. As the transistor MP4 maintains a turn-on state, the latch circuit 210 may maintain a turn-on state based on the supply voltage VDD maintaining a logic high state and having a falling slope. Because the latch circuit 210 in the turn-on state outputs the supply voltage VDD or a voltage similar thereto, the first enable signal EN1 may have a falling slope.

At the time t5, the supply voltage VDD is reduced to a cutoff level LV4, and thus, the first output signal OUT1 may have a falling edge. Specifically, a first voltage of the first node N1 may be determined based on the supply voltage VDD having (and/or corresponding to, etc.) the cutoff level LV4, the transistor MN3 may be turned on by the determined first voltage, and the transistor MP3 may be turned off. That is, the inverter 160 may output the first output signal OUT1 of the ground level or the logic low level L, and in other words, the first voltage detecting circuit 100 may output the first output signal having a falling edge OUT1 at the time t5, but the example embodiments are not limited thereto.

At the time t5, the AND gate circuit 300 may output the reset signal RST having a falling edge in response to (and/or based on) the first output signal OUT1 having a falling edge. That is, the supply voltage detecting circuit 10 may output the reset signal RST of the logic low level L based on the supply voltage VDD having (and/or corresponding to) the cutoff level LV4. For example, the cutoff level LV4 may indicate a voltage of a relatively low level at which the IP 20 is no longer suitable for driving, but the example embodiments are not limited thereto.

From the time t5 to time t6, the second output signal OUT2 and the first enable signal EN1 may be reduced based on the supply voltage VDD being reduced to a second level LV5. That is, the time when the second output signal OUT2 is reduced may be further delayed more than the time when the first output signal OUT1 is reduced by a delay time tD1, but the example embodiments are not limited thereto.

As an example, the delay time tD1 may be determined based on various causes (for example, an RC circuit design factor, a design setting, a configuration value, etc.) of the delay circuit 140. As another example, the delay time tD1 may be determined based on the delay circuit 140 and the transistor MP1, but the example embodiments are not limited thereto. When the supply voltage VDD is reduced from the time t5 to the time t6, an input terminal of the inverter 130 may have a logic low level like the first output signal OUT1, and thus, an output terminal of the inverter 130 may have a logic high level. The transistor MP1 may remain in a turn-off state based on an output voltage of the inverter 130 of a logic high level. In this case, a voltage of the first node N1 increases (e.g., is higher) as a level of a gate-source voltage of the first transistor MN1 is low, and in order for the level of the gate-source voltage of the first transistor MN1 to be lowered, the level of the supply voltage VDD has to be lowered. This is because the supply voltage VDD applied to the core circuit 120 is applied to a gate terminal of the first transistor MN1 via at least one of the plurality of trim resistors R1 to RN. Accordingly, a state of a logic level of the input terminal of the inverter 130 may be shifted at a level of the relatively lower supply voltage VDD, that is, a hysteresis state may occur.

In addition, at the time t6, the second output signal OUT2 and the first enable signal EN1 may be shifted to the logic low level L in response to the second level LV5 of the supply voltage VDD. Thereafter, the supply voltage VDD may be reduced to the ground level GND until time t7, and after a desired and/or predetermined time, an internal voltage of the supply voltage detecting circuit 10 may converge to the ground level GND.

Furthermore, the first enable signal EN1 may maintain the logic high level H from the time t5 to the time t6, but is not limited thereto. As the second output signal OUT2 maintains the logic high level H during the delay time tD1, the transistor MP4 may remain turned off, and the latch circuit 210 may maintain the logic high level H of the first enable signal EN1. That is, the latch circuit 210 may maintain a turn-on state of one of the trim switches SW1 to SWN−1 included in the first detecting circuit 100 in response to the logic high level H of the second output signal OUT2. Accordingly, at least one of the trim switches SW1 to SWN−1 may be selected, the selected trim switch may be maintained in the turn-on state, and thus, it is possible to decrease and/or prevent the reset signal RST from being shifted to an unintended logic level.

Figure 8:
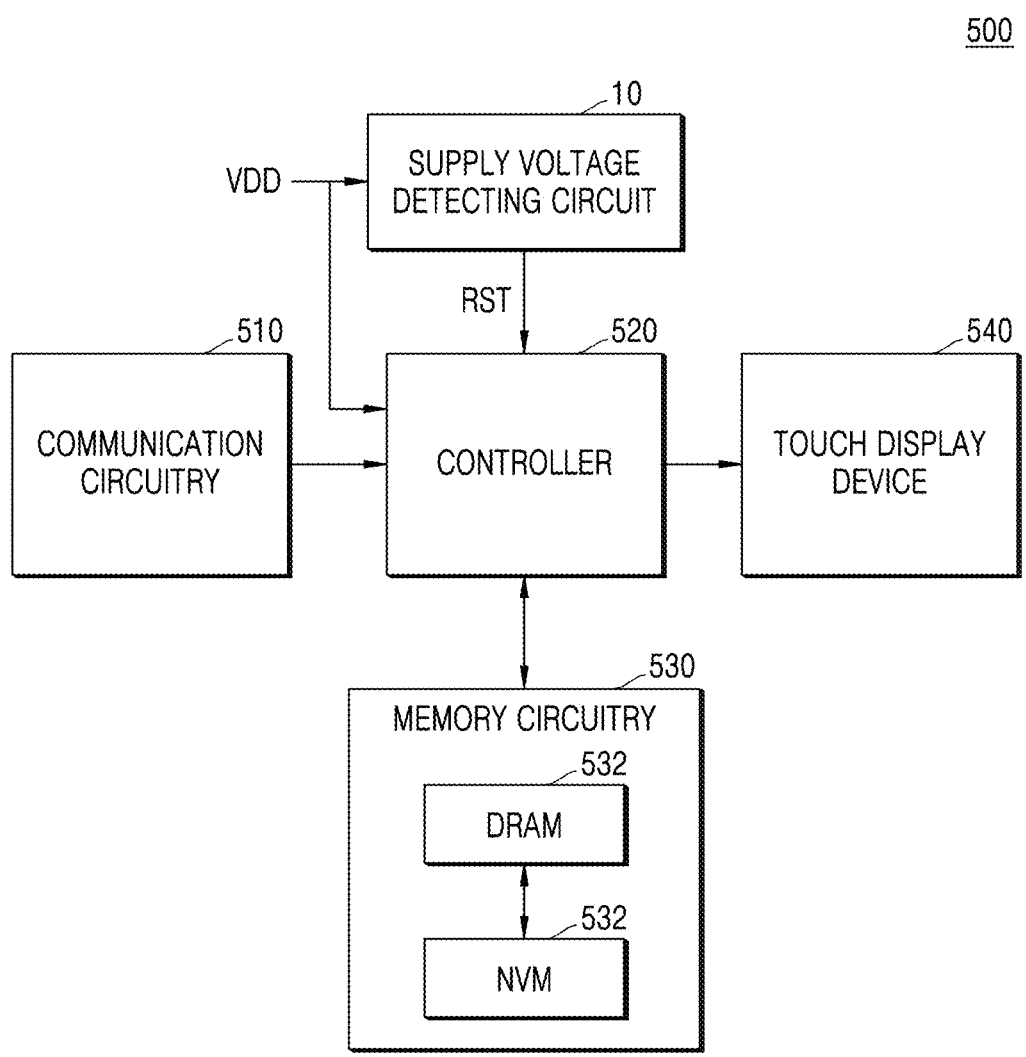
FIG. 8 is a block diagram illustrating an electronic device according to at least one example embodiment of the inventive concepts.

FIG. 8 is a block diagram illustrating an electronic device according to at least one example embodiment of the inventive concepts.

Referring to FIG. 8, an electronic device 500 may include a communication circuitry 510, a controller 520 (e.g., processing circuitry, etc.), a memory circuitry 530, and/or a touch-display circuitry 540, etc., but the example embodiments are not limited thereto and may include a greater or lesser number of constituent components. According to at least one example embodiment, the electronic device 500 may correspond to the electronic device 1 of FIG. 1, etc. For example, the electronic device 500 may be implemented as a mobile device, such as a smartphone, a wearable device, a tablet, a laptop, etc., but the example embodiments are not limited thereto and the electronic device 500 may be other electronic devices. In this case, a reference circuit is not desired and/or required because the supply voltage detecting circuit 10 is included, and thus, a size decrease and/or miniaturization and lowered power consumption are possible. Hereinafter, the electronic device 500 is referred to as a mobile device but is not limited thereto and may be a non-mobile device, such as a PC, a server, a television, a medical and/or health monitoring device, etc., and when the supply voltage VDD has a stable output level, the electronic device 500 may include various devices capable of outputting the reset signal RST of a logic high level.

The communication circuitry 510 may transmit and receive a wireless signal of data input and output through an antenna or may transmit and receive data of a computer system connected through at least one communication port, interface, and/or bus, such as a Universal Serial Bus (USB) port/bus, etc.

The controller 520 may be processing circuitry which controls and processes an overall operation of the electronic device 500. The controller 520 may be implemented as arithmetic processing devices and/or processing circuitry of various types, such as a CPU, an AP, a SOC, an IP block, etc. The controller 520 may perform various arithmetic processing by using the supply voltage VDD, based on the reset signal RST of a logic high level output from the supply voltage detecting circuit 10. Additionally, in some example embodiments, the controller 520 may include and/or perform the functionality of the communication circuitry 510, the memory circuitry 530, and/or the supply voltage detecting circuit 10, etc. Moreover, the controller 520 and/or the communication circuitry 510 may be IP blocks, etc.

The memory circuitry 530 stores various programs and data for the overall operation of the mobile device 500. The memory circuitry 530 may include at least one dynamic random access memory (DRAM) 531 and/or at least one nonvolatile memory 532, etc. The DRAM 531 temporarily stores data processed by the mobile device 500 under a control of the controller 520. The nonvolatile memory 532 includes at least one flash memory, a hard disk drive, etc., and performs a function of downloading a boot loader and an operating system (OS) of the mobile device 500, and performs a mass storage function of the mobile device 500, but is not limited thereto. The nonvolatile memory 532 may include an embedded memory card using a secure digital/multi-media card (SD/MMC) interface protocol. The nonvolatile memory 532 may perform a function of receiving and storing data stored in the DRAM 531 through an SD/MMC interface.

The touch-display device 540 includes a display panel that displays status information, numbers, and characters generated during an operation of the mobile device 500, but is not limited thereto. The display panel may display a list and version information for content stored in the nonvolatile memory 532 under the control of the controller 520. The display panel may be implemented as any one of a flat panel display panel such as an organic light emitting display (OLED) panel including a plurality of light emitting elements, a liquid crystal display (LCD) panel, and so on.

Furthermore, as illustrated, at least one of the communication circuitry 510, the controller 520, the memory circuitry 530, and/or the touch-display device 540 may receive the supply voltage VDD, and the supply voltage detecting circuit 10 may also output the reset signal RST to at least one of the communication circuitry 510, the controller 520, the memory circuitry 530, and/or the touch-display device 540 to which the supply voltage VDD is applied, but the example embodiments are not limited thereto.

While some example embodiments of the inventive concepts has been particularly shown and described with reference to the example embodiments thereof, it will be understood that various changes in form and details may be made therein without departing from the spirit and scope of the following claims.

What is claimed is:

1. A supply voltage detecting circuit comprising:
   trim resistance circuitry including an input terminal, an output terminal, and a plurality of trim resistors connected to each other in series, the input terminal configured to receive a supply voltage;
   a first transistor having a first source/drain terminal electrically connected to the output terminal;
   a plurality of trim switches that each have first ends connected between the plurality of trim resistors, have second ends connected to a gate terminal of the first transistor, and each of the plurality of trim switches is configured to perform a switching operation in response to a switching control signal; and
   a switch controller configured to provide the switching control signal for turning on a first trim switch of the plurality of trim switches based on a process variation of the first transistor when the supply voltage reaches a stable level, and
   the first trim switch configured to apply a voltage dropped by at least some of the plurality of trim resistors from the supply voltage to the gate terminal of the first transistor in response to being turned on.

2. The supply voltage detecting circuit of claim 1, wherein the process variation of the first transistor includes a switching speed of the first transistor.

3. The supply voltage detecting circuit of claim 2, wherein in response to the switching speed of the first transistor having a first value, the first trim switch is further configured to lower a level of the voltage applied to the gate terminal.

4. The supply voltage detecting circuit of claim 3, wherein in response to the switching speed of the first transistor increasing, a combined resistance value of the plurality of trim resistors included between a first end of the first trim switch and the input terminal increases.

5. The supply voltage detecting circuit of claim 1, further comprising:
a first capacitor electrically connected to the input terminal and the second ends of the plurality of trim switches.

6. The supply voltage detecting circuit of claim 5, further comprising:
an inverter configured to receive a first voltage provided from the first source/drain terminal of the first transistor, invert the first voltage, and output the inverted first voltage.

7. The supply voltage detecting circuit of claim 6, further comprising:
a second capacitor configured to receive the supply voltage, wherein
the inverter includes a second transistor having a second source/drain terminal and a third source/drain terminal, and
the second source/drain terminal is electrically connected to the second capacitor.

8. A supply voltage detecting circuit comprising:
a register circuit including an input terminal, an output terminal, and a plurality of resistors connected to each other in series, the input terminal configured to receive a supply voltage;
a first transistor having a first source/drain terminal electrically connected to the output terminal;
a plurality of switches that have first ends connected to a gate terminal of the first transistor, and have second ends connected between each of the plurality of resistors; and
an inverter configured to receive a first voltage provided from the first source/drain terminal of the first transistor.

9. The supply voltage detecting circuit of claim 8, wherein the plurality of switches are configured to perform a switching operation in response to a switching control signal.

10. The supply voltage detecting circuit of claim 9, further comprising a switch controller configured to provide the switching control signal for turning on a first switch of the plurality of switches when the supply voltage reaches a stable level, and
the first switch configured to apply a voltage dropped by at least some of the plurality of resistors from the supply voltage to the gate terminal of the first transistor in response to being turned on.

11. The supply voltage detecting circuit of claim 10, wherein the switch controller configured to provide the switching control signal for turning on the first switch of the plurality of switches based on a process variation of the first transistor.

12. The supply voltage detecting circuit of claim 11, wherein the process variation of the first transistor includes a threshold voltage of the first transistor.

13. The supply voltage detecting circuit of claim 12, wherein the lower the threshold voltage of the first transistor, the lower a level of a voltage applied to the gate terminal.

14. The supply voltage detecting circuit of claim 13, wherein the lower the threshold voltage of the first transistor, the greater a combined resistance value of the plurality of resistors included between one end of the first switch and the input terminal.

15. The supply voltage detecting circuit of claim 8, further comprising:
a first capacitor electrically connected to the input terminal and the second ends of the plurality of switches.

16. The supply voltage detecting circuit of claim 15, further comprising:
a second capacitor configured to receive the supply voltage, wherein
the inverter includes a second transistor having a second source/drain terminal and a third source/drain terminal, and
the second source/drain terminal is electrically connected to the second capacitor.

17. A supply voltage detecting circuit comprising:
resistance module including a plurality of resistors, the resistance module configured to receive a supply voltage;
a first transistor connected between the resistance module and ground;
a switch module connected to a gate of the first transistor and the resistance module, the switch module including a plurality of switches; and
a switch controller configured to control the switch module so that different voltage levels are applied to the gate of the first transistor.

18. The supply voltage detecting circuit of claim 17, wherein the switch controller is further configured to:
control the switch module so that the voltages of different voltage levels are applied to the gate of the first transistor according to a process variation of the first transistor.

19. The supply voltage detecting circuit of claim 18, wherein the process variation of the first transistor includes a switching speed of the first transistor.

20. The supply voltage detecting circuit of claim 19, wherein the higher the switching speed, the lower the level of a voltage applied to the gate.

* * * * *